(12) United States Patent
Koyama

(10) Patent No.: US 9,799,508 B2
(45) Date of Patent: Oct. 24, 2017

(54) PROCESS OF FORMING NITRIDE SEMICONDUCTOR DEVICE

(71) Applicant: Sumitomo Electric Industries, Ltd., Osaka-shi (JP)

(72) Inventor: Masatoshi Koyama, Yokohama (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 15/299,034

(22) Filed: Oct. 20, 2016

(65) Prior Publication Data

US 2017/0117132 A1 Apr. 27, 2017

(30) Foreign Application Priority Data

Oct. 21, 2015 (JP) .................. 2015-207345

(51) Int. Cl.
*H01L 21/324* (2006.01)
*H01L 21/02* (2006.01)
*H01L 21/265* (2006.01)
*H01L 21/66* (2006.01)

(52) U.S. Cl.
CPC .... *H01L 21/0217* (2013.01); *H01L 21/02266* (2013.01); *H01L 21/02274* (2013.01); *H01L 21/2654* (2013.01); *H01L 21/324* (2013.01); *H01L 22/12* (2013.01)

(58) Field of Classification Search
CPC ........... H01L 21/0217; H01L 21/02266; H01L 22/12; H01L 21/2654; H01L 21/324; H01L 21/02274
See application file for complete search history.

(56) References Cited

U.S. PATENT DOCUMENTS

2014/0179078 A1* 6/2014 Komatani ......... H01L 21/31155
438/285

OTHER PUBLICATIONS

Recht et al., "Nonalloyed Ohmic Contacts in AlGaN/GaN HEMTs by Ion Implantation With Reduced Activation Annealing Temperature," IEEE Electron Device Letters, vol. 27, No. 4, Apr. 2006, pp. 205-207.

* cited by examiner

*Primary Examiner* — Kyoung Lee
(74) *Attorney, Agent, or Firm* — Venable LLP; Michael A. Sartori; Miguel A. Lopez

(57) ABSTRACT

A process of forming a nitride semiconductor device is disclosed. The process includes steps of (a) implanting impurities into a portion of nitride semiconductor layers epitaxially grown on a substrate; (b) forming a silicon nitride (SiN) film on the nitride semiconductor layers; and (c) annealing the nitride semiconductor layers for activating the implanted impurities as covering the nitride semiconductor layers by the SiN film. The process has a feature that the SiN film shows, in a Fourier Transformation Infrared (FT-IR) spectroscopy measured before the step of annealing, absorbance peaks attributed to translational motions of a Si—H bond and an N—H bond at most $\frac{1}{30}$ of an absorbance peak attributed to a SiN bond.

11 Claims, 10 Drawing Sheets

PROCESS OF FORMING NITRIDE SEMICONDUCTOR DEVICE

BACKGROUND OF THE INVENTION

1. Field of the Invention

The present invention relates to a process of forming a nitride semiconductor device type of high electron mobility transistor (HEMT).

2. Background Arts

A semiconductor device using nitride semiconductor materials have been practically popular in a field because of superior breakdown voltages inherently attributed to the nitride semiconductor materials. A semiconductor device type of HEMT is widely used in the field. Recht; F et al., has reported in IEEE Electron Device Letters, vol. 27 (2006) pages 205 to 207, that a HEMT has n+ regions beneath a source electrode and a drain electrode in order to improve contact resistance of those electrodes.

The n+ regions may be formed by implanting ions therein and subsequent annealing at a temperature higher than 1000° C. in order to activate implanted ions. However, such annealing sometimes degrades the quality of the mother semiconductor materials to be annealed. An insulating film made of inorganic material, conventionally a silicon nitride (SiN) film formed by a plasma enhance chemical vapor deposition (p-CVD) technique, may prevent the degradation of the semiconductor surface. However, after annealing and removing the insulating film, a surface of the semiconductor materials sometimes shows degraded morphology. A HEMT based on such a degraded surface shows an increased leak current and a lesser reliability.

SUMMARY OF THE INVENTION

An aspect of the present invention relates to a process of forming a semiconductor device. The process includes steps of: (a) implanting impurities into a portion of nitride semiconductor layers that are epitaxially and sequentially grown on a substrate, where the implanted impurities form implanted regions within the nitride semiconductor layer; (b) forming a silicon nitride (SiN) film on the nitride semiconductor layers; and (c) annealing the nitride semiconductor layers and the substrate for activating the implanted impurities as covering the nitride semiconductor layers by the SiN film. A feature of the process of the present invention is that the SiN film shows, in a Fourier Transformation Infrared (FT-IR) spectroscopy measured before the step of annealing, absorbance peaks attributed to translational motions of a Si—H bond and an N—H bond at most 1/30 of an absorbance peak attributed to a SiN bond.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment of a semiconductor device according to the present invention will be described as referring to accompanying drawings. In the description of the drawings, numerals or symbols same with or similar to each other will refer to elements same with or similar to each other without duplicating explanations.

Figure 1:
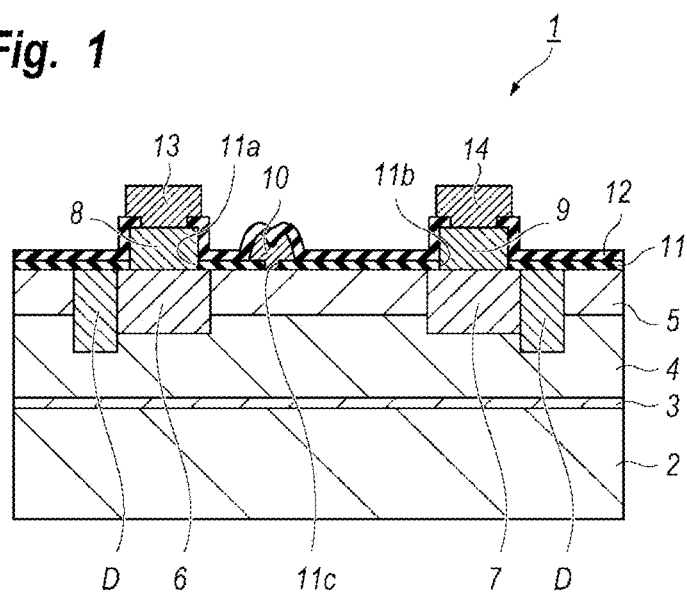
FIG. 1 shows a cross section of a semiconductor device type of high electron mobility transistor (HEMT) according to embodiment of the present invention.

FIG. 1 shows a cross section of a semiconductor device according to the present invention. The semiconductor device, which has a type of transistor of, what is called, a high electron-mobility transistor (HEMT), includes a substrate 2, a buffer layer 3, a channel layer 4, a barrier layer 5, n+ regions, 6 and 7, electrodes of a source 8, a drain 9, and a gate 10, and an insulating film 11. The HEMT 1 also provides a passivation film 12 that covers whole of the insulating film 11 and the electrodes 8 to 10. The source electrodes 8 and the drain electrode 9 are connected to respective interconnections, 13 and 14, through openings formed in the passivation film 12. The HEMT 1 in the channel layer 4 and the barrier layer 5 thereof is electrically isolated from other HEMTs formed in the common substrate 2 by isolation regions D provided outside of the n+ regions, 6 and 7. The HEMT 1 thus configured inherently forms a two dimensional electron gas (2 DEG) in an interface between the channel layer 4 and the barrier layer 5, exactly, in the channel layer 4 adjacent to the interface against the barrier layer 5, and the 2 DEG may operate as a channel for the electron transportation.

The substrate 2, which provides a base for a crystal growth, may be made of, for instance, silicon (Si), silicon carbide (SiC), sapphire (Al$_2$O$_3$), aluminum nitride (AlN), diamond (C), and so on. The HEMT 1 of the present embodiment provides the substrate made of SiC.

The buffer layer 3, which is epitaxially grown on the substrate 2, may be made of aluminum nitride (AlN) or aluminum gallium nitride (AlGaN) with a thickness of not thinner than 5 nm but not thicker than 50 nm. The buffer layer 3 preferably has resistivity greater than that of the channel layer 4.

The channel layer 4, which is also epitaxially grown on the buffer layer 3, may be made of nitride semiconductor material, typically, gallium nitride (GaN) with a thickness of not thinner than 0.3 μm but not thicker than 3.0 μm. As described, the channel layer 4 in a side opposite to the buffer layer 3 forms the channel for the carrier transportation.

The barrier layer 5, which is also epitaxially grown on the channel layer 4, may be made of nitride semiconductor material having the electron affinity greater than that of the channel layer 4. Typical materials for the barrier layer 5 are, for instance, AlGaN, indium aluminum nitride (InAlN), or indium aluminum gallium nitride (InAlGaN). The barrier layer 5 of the present HEMT 1 has the barrier layer 5 made of AlGaN with a thickness of not thinner than 1 nm but not greater than 30 nm. The HEMT 1 may further provide a cap layer made of GaN on the barrier layer 5.

The n+ regions, 6 and 7, may be formed by implanting impurities into the barrier layer 5 and the channel layer 4 by the depth of not shallower than 5 nm but not deeper than 300 nm. The impurities to be implanted into the n+ regions, 6 and 7, may be silicon (Si) or other atoms or ions operable as n-type dopants in the barrier layer 5 and the channel layer 4.

The source and drain electrodes, 8 and 9, which are provided on the barrier layer 5, exactly, the source electrode 8 is provided on and in contact to the n+ region 6; while, the drain electrode 9 is provided on and in contact to the other n+ region 7. The source and drain electrodes, 8 and 9, may be a stack of titanium (Ti) and aluminum (Al), where Ti is in contact to the n+ regions, 6 and 7.

The gate electrode 10, which is provided on the barrier layer 5 and between the source and drain electrodes, 8 and 9, may be a stack of nickel (Ni) and gold (Au), where Ni is in contact to the barrier layer 5. The insulating film 11, which covers the barrier layer 5, provides openings, 11a to 11c, each corresponding to the source to gate electrodes, 8 to 10. That is, the electrodes, 8 and 10, are in contact to the n+ regions, 6 and 7, through the openings, 11a and 11b, and in contact to the barrier layer 5 through the opening 11c, respectively. The insulating film 11 may be made of silicon nitride (SiN).

Next, a process of forming the HEMT 1 will be described as referring to FIGS. 2A to 5B, each showing cross sections at respective steps of the process.

Figure 2A:
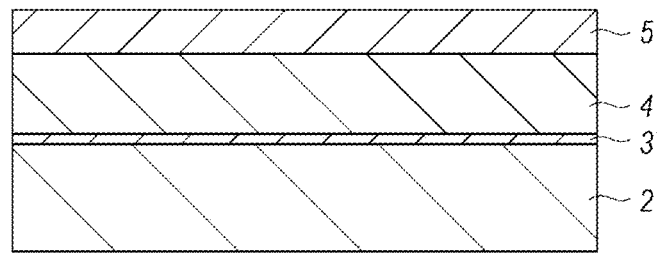
FIGS. 2A to 2C show steps of a process of forming the HEMT shown in FIG. 1.
Figure 2B:
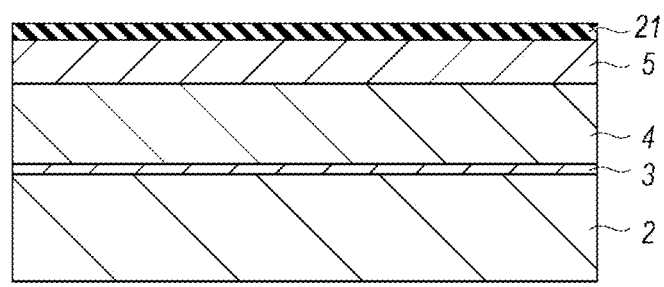
Figure 2C:
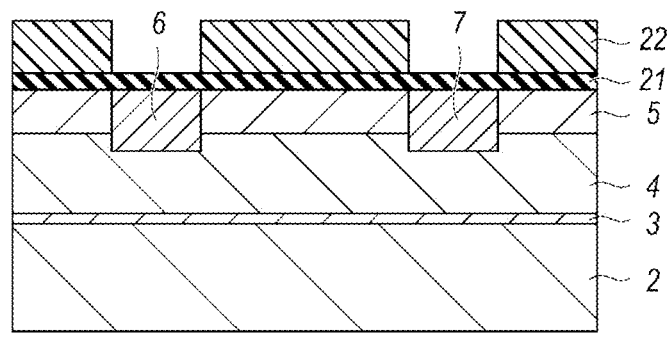

First, the process sequentially grows the buffer layer 3, the channel layer 4, and the barrier layer 5 on the substrate 2 by the Metal Organic Vapor Phase Epitaxy (MOVPE) technique, as shown in FIG. 2A. Then, silicon nitride (SiN) is deposited on the barrier layer 5 by, for instance, Chemical Vapor Deposition (CVD) technique as an insulating layer 21 (FIG. 2B). After preparing a patterned photoresist 22 on the insulating layer 21, the process implants silicon ions (Si+) within the barrier layer 5 and the channel layer 4 through the SiN insulating layer 21. The patterned photoresist 22 has openings in regions where the n+ regions, 6 and 7, are to be formed, as shown in FIG. 2C. The dosage of Si ions is not less than $1 \times 10^{14}$ but not greater than $1 \times 10^{16}$ cm$^{-2}$. The implantation through a SiN insulating layer 21 may shift a peak of a profile for implanted ions toward the surface of the material to be implanted. That is, the direct implantation without any insulating films forms a range profile with a peak at a substantial depth from the surface. On the other hand, the implantation through an insulating film may shift the peak position toward the surface. Accordingly, a doping profile may shows a maximum at a vicinity of the surface, that is, the carrier concentration becomes maximum at the surface and the contact resistance of the electrodes may be reduced.

Figure 3A:
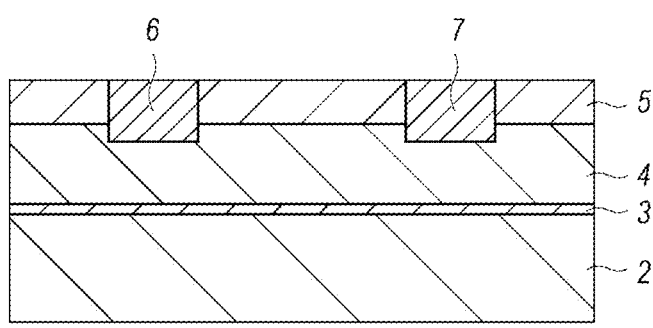
FIGS. 3A to 3C show steps of the process subsequent to the step shown in FIG. 2C.
Figure 3B:
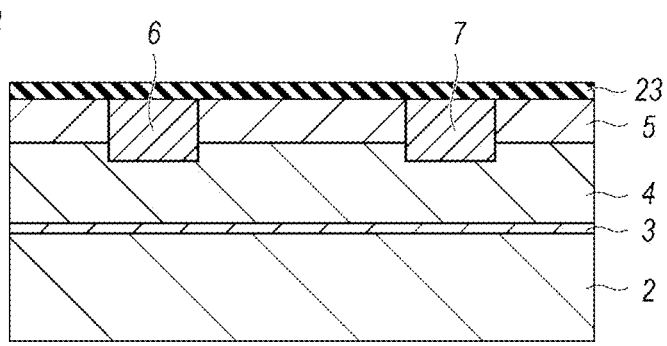

Removing the patterned photoresist 22 and the SiN layer 21 by an organic solvent and an acid, the process exposes the surface of the barrier layer 5 (FIG. 3A). Then, another SiN layer 23 is deposited on the exposed surface of the barrier layer 5 by RF sputtering under conditions of: a pressure of 0.1 Pa under nitrogen (N$_2$) atmosphere, RF power of 500 W. The SiN layer 23 may operate as a protection layer during annealing that activates the implanted Si+ impurities in the n+ regions, 6 and 7. As alternatives, the SiN layer 23 may be formed by electron-cyclotron resonance (ECR) sputtering; or plasma-enhanced chemical vapor deposition (p-CVD) accompanied with post heat treatment. The ECR sputtering may have conditions of: microwave power of 400 to 600 W, RF power of 400 to 600 W, argon (Ar) flow rate of 20 to 50 sccm, and nitrogen (N$_2$) flow rate of 5 to 7 sccm; while, the p-CVD may have conditions of: silane (SiH$_4$) flow rate of 3 to 15 sccm, ammonia (NH$_3$) flow rate of 0 to 10 sccm, N$_2$ flow rate of 20 to 200 sccm, deposition temperature of 250 to 300° C., and post heat treatment of 30 to 60 minutes at a temperature of 800 to 1000° C.

Figure 3C:
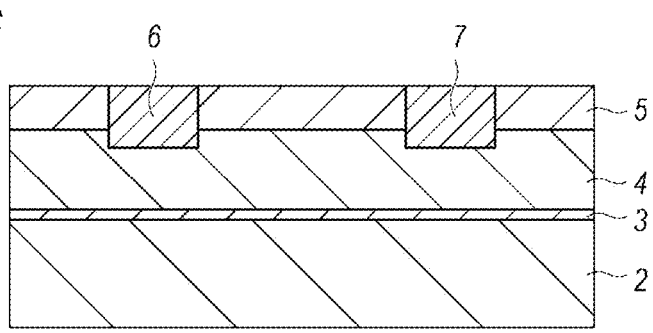

After the deposition of the SiN film 23, at least the channel layer 4, the barrier layer 5, and the SiN film 23 are annealed; that is, the implanted regions, 6 and, including the SiN film 23 covering the implanted regions and 7, are annealed using, for instance, rapid thermal anneal (RTA), or any other conventional furnace, under an atmosphere of nitrogen (N$_2$) or other inactive gas and a temperature of not lower than 1000° C. but not higher than 1300° C. The annealing thus carried out may activate the implanted impurities without degrading the surface morphology of the barrier layer 5, and the n+ regions, 6 and 7, may show the doping density of $1.0 \times 10^{19}$ to $5.0 \times 10^{20}$ cm$^{-3}$ and the resistivity of lower than 200Ω/sq. Then, the process removes the SiN film 23 by, for instance, wet etching using an acid (FIG. 3C).

Figure 4A:
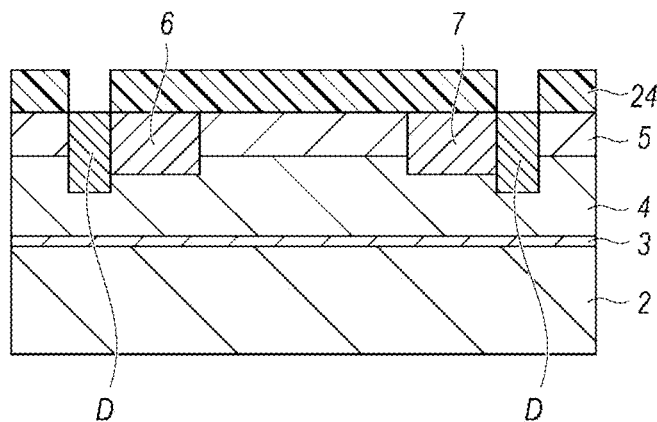
FIGS. 4A to 4C show steps of the process subsequent to the step shown in FIG. 3C.
Figure 4B:
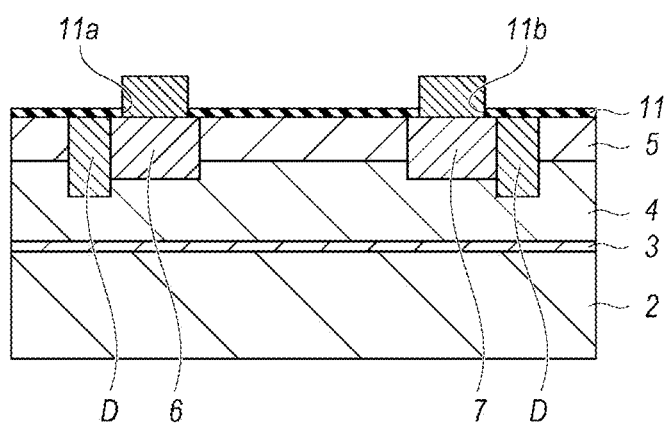

The process implants argons (Ar), oxygens (O), or other ions into the barrier layer 5 and the channel layer 4 after forming another patterned photoresist 24 to form the isolation regions D. The patterned photoresist 24 covers at least a primary portion of the HEMT 1, that is, the n+ regions, 6 and 7, and a region between the n+ regions, 6 and 7, as shown in FIG. 4A. The dosage of the ions is, for instance, $1.0 \times 10^{12}$ to $5.0 \times 10^{15}$ cm$^{-2}$. Thus, the isolation regions D may be formed so as to surround the primary portion of the HEMT 1.

Removing the patterned photoresist 24, the process forms the insulating film 11 on the barrier layer 5. Forming openings, 11a and 11b, in the insulating film 11 at the n+ regions, 6 and 7, respectively, the source and drain electrodes, 8 and 9, are formed so as to be in contact to the n+ regions, 6 and 7, through the openings, 11a and 11b, by a metal evaporation and subsequent a lift-off technique.

Figure 4C:
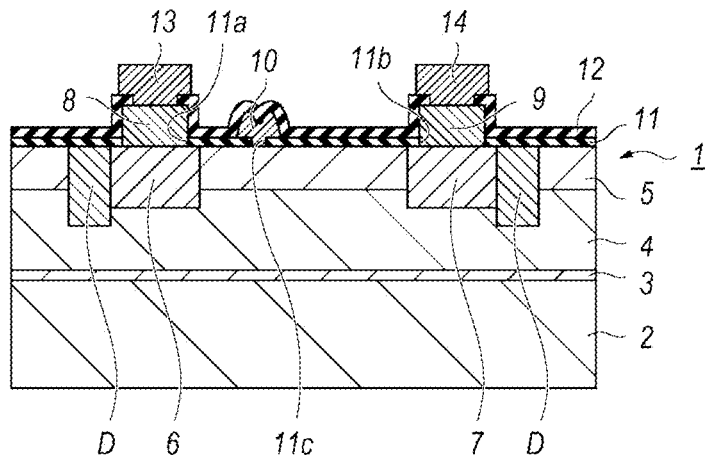
Figure 5A:
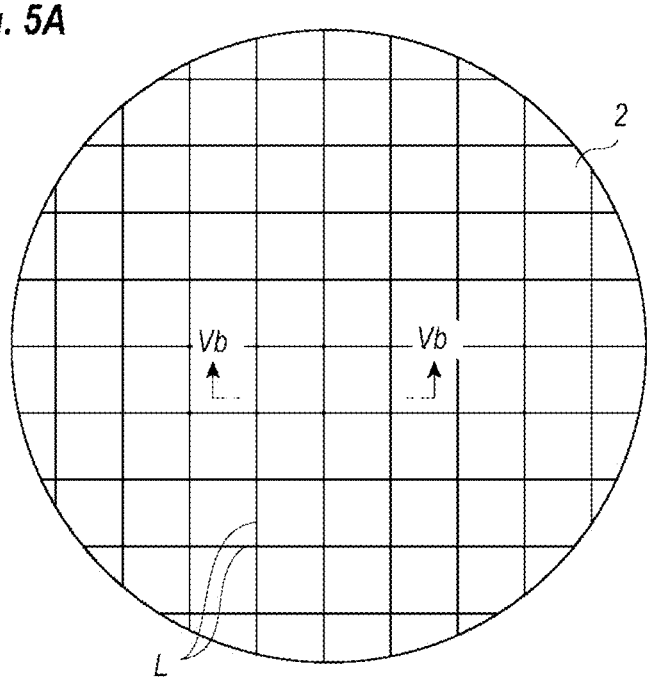
FIGS. 5A and 5B show steps of the process subsequent to the step shown in FIG. 4C.
Figure 5B:
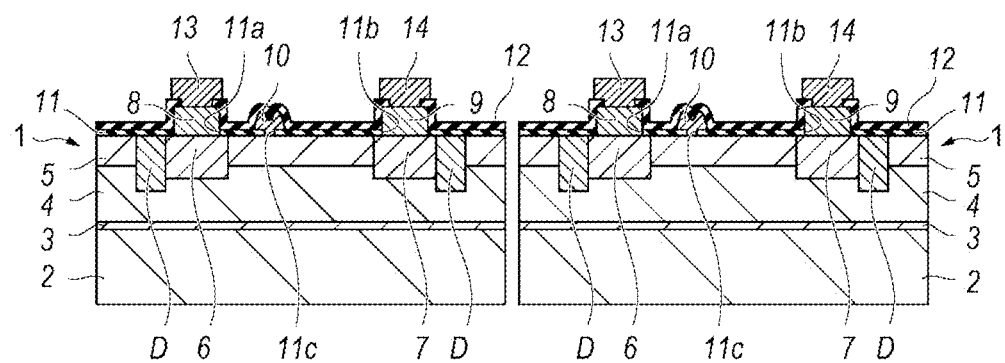

Then, forming another opening 11c in the insulating film 11 between the source and drain electrodes, 8 and 9, and subsequent metal evaporation and lift-off technique, the gate electrode 10 may be formed so as to be in contact to the barrier layer 5, as shown in FIG. 4C. Thus, the process of forming the HEMT 1A completes. The HEMT 1A is electrically isolated from other HEMTs, which are also formed on the substrate 2, by the isolation regions D but may be electrically coupled through interconnections, 13 and 14, that are connected to the source and drain electrodes, 8 and 9, through the openings in the passivation film 12. The insulating film 11 and the passivation film 12 may cover only the primary portion of the HEMT 1A, namely, the n+ regions, 6 and 7, and the region between the n+ regions, 6 and 7. The insulating film 11 and the passivation film 12 may expose the isolation regions D and regions between the isolation regions D of the neighbor HEMT. Finally, as shown in FIGS. 5A and 5B, the process divides the substrate 2 along scribe lines L, by dicing saw, to form semiconductor chips each including at least one HEMT 1A.

Figure 6A:
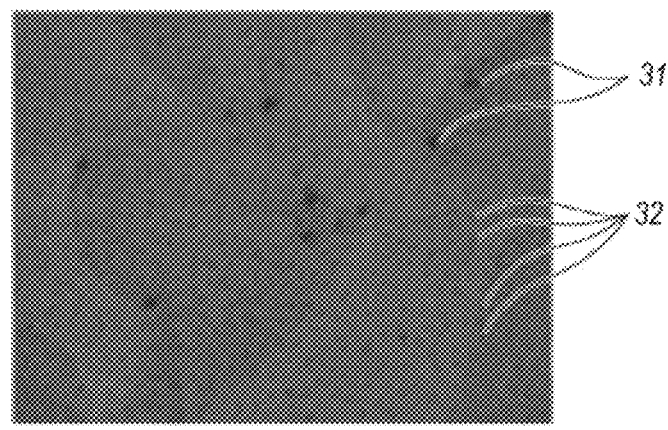
FIG. 6A shows a surface of the barrier layer after annealing as covering the surface with SiN film formed by plasma enhance chemical vapor deposition (p-CVD) technique without post annealing.
Figure 6B:
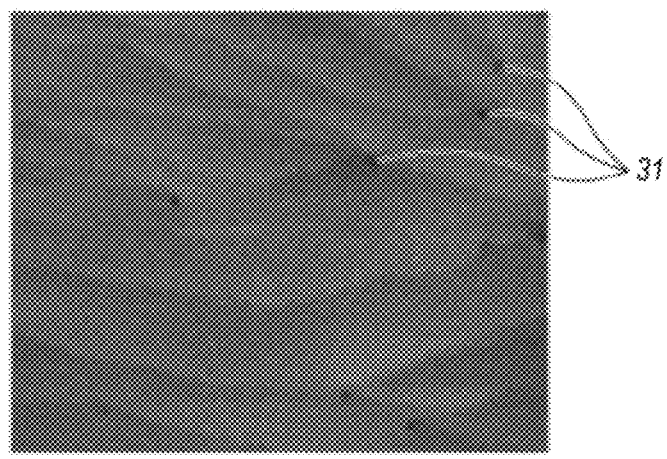
FIG. 6B shows a surface of the barrier layer after annealing as covering the surface with SiN film formed by RF sputtering of the present invention.

The method of the present invention forms the SiN film 23 for activating the implanted ions by the RF sputtering. FIGS. 6A and 6B compare surface morphology of the barrier layer 5 in a case where the SiN film 23 is formed by the RF sputtering with another surface where the SiN film 23 is formed by other techniques. FIG. 6A shows a surface of the barrier layer 5 when the SiN film is formed by the p-CVD technique without the post annealing; while, FIG. 6B shows the surface of the barrier layer 5 when the SiN film 23 is formed by the RF sputtering. FIGS. 6A and 6B show the surfaces after removing the SiN film 23.

As FIGS. 6A and 6B show; the surfaces of the barrier layer 5 sparsely leave pits 31 which are formed during the epitaxial growth of the barrier layer 5. The surface shown in FIG. 6A further leaves other pits 32 with diameters smaller than that of the former pits 31 in a whole area of the surface. The surface shown FIG. 6B leaves no smaller pits 32.

Figure 7:
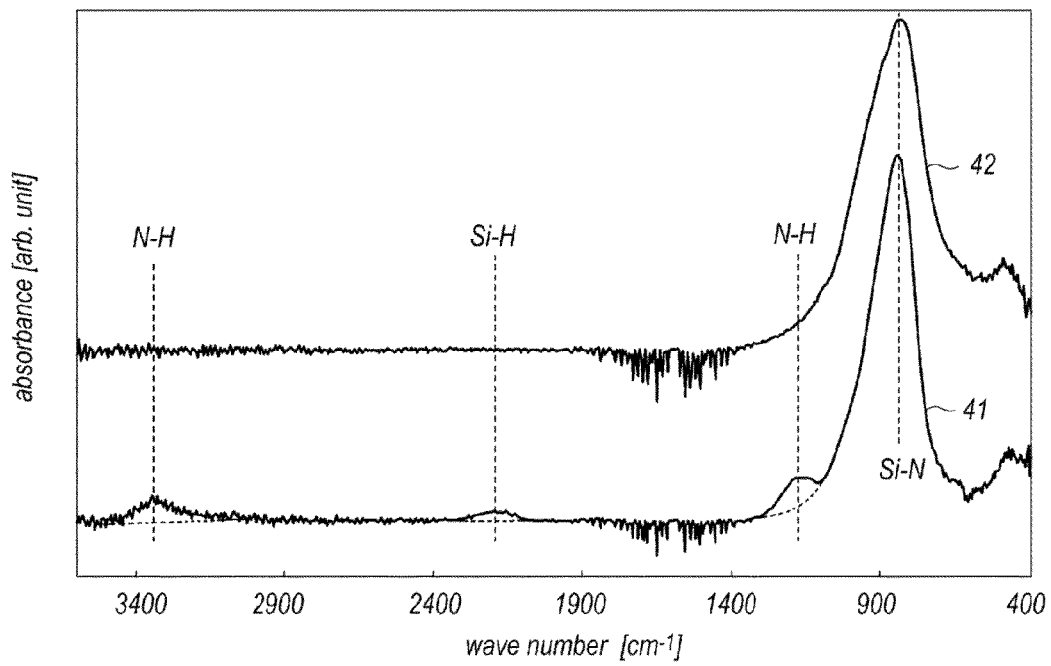
FIG. 7 compares FT-IR spectra of SiN film formed by the p-CVD technique without post annealing and SiN film formed by the RF sputtering of the present invention.

FIG. 7 compares the FT-IR spectrum of the SiN films 23 formed by the RF sputtering given, which is denoted by a behavior 42, with that obtained by the p-CVD without post annealing, which is denoted by another behavior 41. In FIG. 7, the horizontal axis corresponds to wave numbers, namely, reverses of wavelengths; while, the vertical axis corresponds to the transmittance of the SiN film. The SiN film formed by the RF sputtering shows no peaks around 2,200 cm$^{-1}$, which is due to the absorption by the translation motion of the Si—H bond, around 3,300 cm$^{-1}$, which is due to the translational motion of the N—H bond, and around 1,200 cm$^{-1}$, which is due to the rotational motion of the N—H bond. That is, the absorbance by the translational motion of the Si—H bond, that by the translation motion of the N—H bond, and that by the rotational motion of the N—H bond is smaller than the absorbance by the translational motion of the Si—N bond, where the absorbance of those motions may be measured from the background as denoted by a dotted line in the behavior 41. Taking the measurement accuracy in the FT-IR spectrum into account, the absorbance due to those motions may be preferably 1/50 smaller than the translational motion of the Si—N bond. That is, the SiN film formed by the RF sputtering contains hydrogens (H) far less than that contained in the SiN film formed by the p-CVD without post annealing.

Thus, according to the process of the present invention, the SiN film is deposited on the barrier layer 5 by the RF sputtering, where the SiN film thus formed contains hydrogens (H) by an extremely limited amount such that the absorbance by the translational motion of the Si—H bond, that of the N—H bond, and the absorbance by the rotational motion of the N—H bond is 1/30 smaller than the absorbance by the translational motion of the Si—N bond, where those are measured in the FT-IR spectrum. Because the SiN film contains hydrogens by an extremely limited amount, the dissociation of hydrogens from the SiN film and the reaction between the SiN film 23 and the barrier layer 5 originated from hydrogens may be restricted during the annealing, which effectively suppresses the degradation in the surface morphology of the barrier layer 5. The absorbance originated to hydrogen, namely, that by the translational motions of the Si—H bond and the N—H bond, and that by the rotational motion of the N—H bond, may be 1/50 smaller than that of the translational motion of the Si—N bond.

Such an SiN film 23 showing those absorbance may be obtained by the ECR sputtering with conditions of: the microwave power of 400 to 600 W, the RF power of 400 to 600 W, the Ar flow rate of 20 to 50 sccm, and the nitrogen ($N_2$) flow rate of 5 to 7 sccm, Also, such an SiN film 23 may be obtained by the p-CVD with conditions of: a silane ($SiH_4$) flow rate of 3 to 15 sccm, an ammonia ($NH_3$) flow rate of 0 to 10 sccm, a nitrogen ($N_2$) flow rate of 20 to 200 sccm, a deposition temperature of 250 to 300° C., and subsequent thermal treatment of the deposited SiN film at a temperature of 800 to 1000° C. for 30 to 60 minutes. Also, such a SiN film may be formed by the RF sputtering with conditions of: a deposition pressure of 0.1 Pa in nitrogen ($N_2$) atmosphere, and RF power of 500 W.

The HEMT 1A of the present invention may provide the n+ regions, 6 and 7, with impurity density of not smaller than $1.0 \times 10^{19}$ cm$^{-3}$ but not greater than $5.0 \times 10^{20}$ cm$^{-3}$, which sets the resistivity thereof smaller than 200Ω/sq. Also, the process of the embodiment may further provide steps of, forming an insulating layer 21 on the barrier layer 5 in advance to the implantation and removing the insulating layer 21 after the implantation. That is, the implantation of the present embodiment is carried out through the insulating layer 21. The insulating layer 21 may absorb or modify damages by the implanted impurities onto the barrier layer 5 and the channel layer 4, which may suppress the degradation of the surface morphology of the barrier layer 5.

Figure 8:
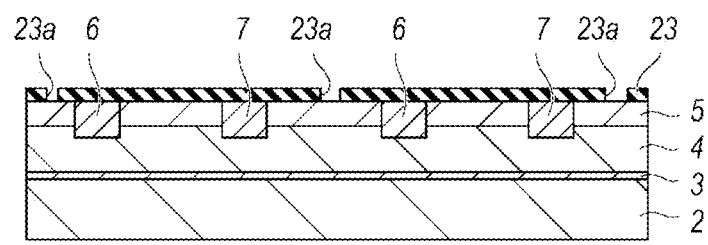
FIG. 8 shows a modification of a process of forming the semiconductor device of the present invention.

The SiN film 23 inherently has thermal expansion co-efficient different from those of the barrier layer 4, the channel layer, and the substrate 2. Accordingly, stresses are induced within the SiN film 23 and the epitaxial layers, 4 and 5, during the annealing. The stresses remain as a residual stress even after the annealing. For instance, the stress induced in the epitaxial layers, 4 and 5, is about −1.5 GPa in the present embodiment. Those stresses sometimes cause cracks in the epitaxial layers, 4 and 5, and in the SiN film 23. The process may partially remove the SiN film 23 in regions 23a except for the implanted regions, 6 and 7, and the primary region of the HEMT 1A between the implanted regions, 6 and 7, so as to expose the surface of the barrier layer 5, as shown in FIG. 8. That is, the SiN film 23 may be partially removed in regions 23a corresponding to scribe lines between the respective chips.

Figure 9:
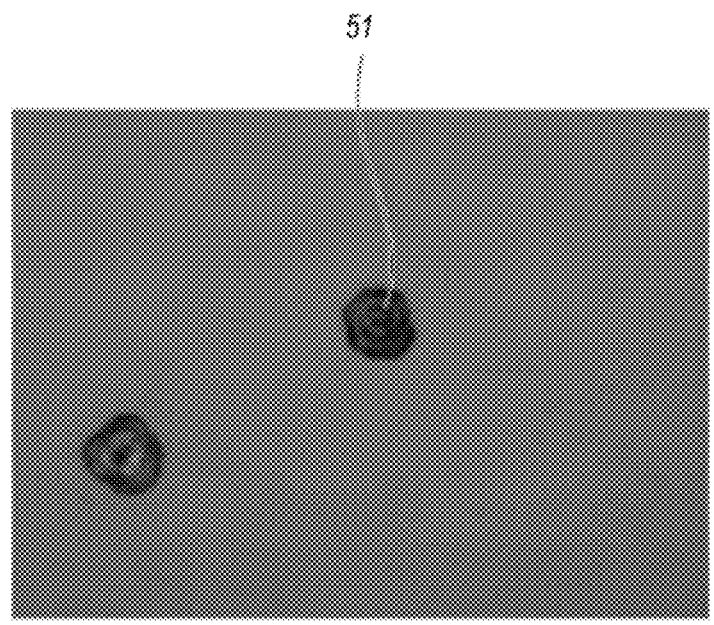
FIG. 9 shows a surface of the barrier layer after annealing, where the surface is exposed within an opening in an insulating layer during the annealing.

FIG. 9 shows a surface of the barrier layer 5 in the regions 23a not covered with the SiN film 23. Although the surface of the barrier layer 5 leaves many pits 51 in those regions 23a, the regions 23a overlap with the scribe lines L shown in FIG. 5A which do not affect the performance of the HEMT 1A and will be removed at the subsequent process shown in FIG. 5B.

Figure 10:
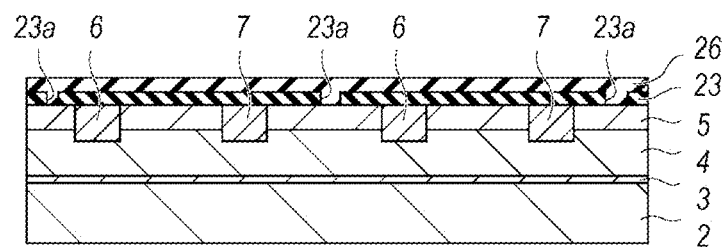
FIG. 10 shows a step of the process subsequent to that shown in FIG. 9.

Also, as shown in FIG. 10, the regions 23a may be covered with an additional SiN film 26. That is, the process may form the additional SiN film 26 on the SiN film 23 and the barrier layer 5 in the regions 23a between the SiN films 23. The additional SiN film 26 preferably causes smaller residual stress against the nitride semiconductors, 2 to 5. For instance, the difference of the residual stress induced between the SiN film 26 and the nitride semiconductor materials from that induced between the SiN film 23 and the nitride semiconductor materials is about −1 GPa. That is, the additional SiN film 26 may moderate the residual stress by about −1 GPa from the SiN film 23. Also, the SiN film 26 may suppress the degradation of the surface morphology of the barrier layer 5 compared with a case where the regions 23a exposes the surface of the barrier layer 5 during the annealing. The additional SiN film 26 may have a composition of silicon (Si) smaller than that of the SiN film 23.

The method of producing the semiconductor device thus disclosed is not restricted to those described above and various modifications or alternatives may be applicable. For instance, the SiN film 23 of the present invention may be formed by other sputtering techniques except for the RF sputtering, such as the magnetron sputtering, the ion-beam sputtering, and/or the DC sputtering as far as the deposited SiN film 23 shows, in the FT-IR spectrum, the absorption peaks attributed to the translational motion of the N—H bond and the Si—H bond 1/30, or preferably 1/50 less than that attributed to the Si—N bond, which is the key feature of the SiN film 23.

The present application claims the benefit of priority of Japanese Patent Application No. 2015-207345, filed on Oct. 21, 2015, which is incorporated herein by reference.

What is claimed is:

1. A process of producing a semiconductor device, comprising steps of:
implanting impurities into a portion of nitride semiconductor layers that are epitaxially and sequentially grown on a substrate, that implantation of the impurities forming implanted regions within the nitride semiconductor layers;
forming a silicon nitride (SiN) film on the nitride semiconductor layers; and
annealing the nitride semiconductor layers and the substrate for activating the implanted impurities as covering the nitride semiconductor layer by the SiN film,
wherein the SiN film shows, in a Fourier Transformation Infrared (FT-IR) spectroscopy measured before the step of annealing, absorbance peaks attributed to translational motions of a Si—H bond and an N—H bond at most 1/30 of an absorbance peak attributed to the translation motion of a Si—N bond.

2. The process of claim 1,
wherein the SiN film shows, in the FT-IR spectrum measured before the step of annealing, the peaks attributed to the translational motions of the Si—H bond and the N—H bond at most 1/50 of the peak attributed to the translational motion of the Si—N bond.

3. The method of claim 1,
wherein the step of annealing is carried out at a temperature of 1000 to 1300° C.

4. The method of claim 1,
wherein the step of forming the SiN film is carried out by a radio frequency (RF) sputtering under conditions of: RF power of 500 W and a pressure of 0.1 Pa under nitrogen ($N_2$) atmosphere.

5. The method of claim 1,
wherein the step of forming the SiN film is carried out by an electron cyclotron resonance (ECR) sputtering under conditions of: microwave power of 400 to 600 W, RF power of 400 50 600 W, an argon (Ar) flow rate of 20 to 50 sccm, and a nitrogen ($N_2$) flowrate of 5 to 7 sccm.

6. The method of claim 1,
wherein the step of forming the SiN film is carried out by a plasma-enhanced chemical vapor deposition (p-CVD) accompanied with post heat treatment, the p-CVD being carried out under conditions of: a silane ($SiH_4$) flow rate of 3 to 15 sccm, an ammonia ($NH_3$) flow rate of 0 to 10 sccm, nitrogen ($N_2$) flow rate of 20 to 200 sccm, a deposition temperature of 250 to 300° C., and the post heat treatment of a temperature of 800 to 1000° C. for 30 to 60 minutes.

7. The method of claim 1,
wherein the step of implanting the impurities forms regions in the nitride semiconductor layers, the regions having impurity density of $1.0 \times 10^{19}$ to $5.0 \times 10^{20}$ $cm^{-3}$, and
wherein the regions after the step of annealing have resistivity smaller than 200Ω/sq.

8. The method of claim 1,
further including a step of partially removing the SiN film so as to expose a portion of a surface of the nitride semiconductor layers after forming the SiN film but before annealing,
wherein the SiN film covers at least implanted regions and a region between the implanted regions.

9. The method of claim 8,
further including a step of, before annealing, forming an additional SiN film on the partially removed SiN film and the exposed surface of the nitride semiconductor layers before annealing,
wherein the additional SiN film has a silicon composition smaller than a silicon composition of the SiN film.

10. The method of claim 1,
wherein the SiN film shows an absorbance peak attributed to a rotational motion of a N—H bond at most 1/30 of the absorbance peak attributed to the translational motion of the Si—N bond.

11. The method of claim 1,
further including steps of:
forming another SiN film on the nitride semiconductor layers before the step of implanting the impurities, and removing the another SiN film after the step of implanting the impurities but before the step of forming the SiN film,
wherein the step of implanting impurities is carried out through the another SiN film.

* * * * *